(12) United States Patent
Takahashi et al.

(10) Patent No.: US 7,972,754 B2
(45) Date of Patent: Jul. 5, 2011

(54) FLUORINATED POLYMER, NEGATIVE PHOTOSENSITIVE RESIN COMPOSITION AND PARTITION WALLS

(75) Inventors: Hideyuki Takahashi, Tokyo (JP); Kenji Ishizeki, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 303 days.

(21) Appl. No.: 12/138,648

(22) Filed: Jun. 13, 2008

(65) Prior Publication Data

US 2008/0254388 A1 Oct. 16, 2008

Related U.S. Application Data

(63) Continuation of application No. PCT/JP2006/324984, filed on Dec. 14, 2006.

(30) Foreign Application Priority Data

Dec. 15, 2005 (JP) .................. 2005-361910

(51) Int. Cl.
*G03F 7/004* (2006.01)
*C08F 8/30* (2006.01)

(52) U.S. Cl. .... 430/18; 430/287.1; 430/905; 525/326.2; 525/374

(58) Field of Classification Search .............. 430/270.1, 430/325, 907, 287.1, 288.1; 525/326.2, 374
See application file for complete search history.

(56) References Cited

U.S. PATENT DOCUMENTS

| 6,689,539 | B2 | 2/2004 | Kamiya et al. |
| 7,232,648 | B2 | 6/2007 | Takahashi et al. |
| 7,267,929 | B2 | 9/2007 | Takahashi et al. |
| 7,579,066 | B2 * | 8/2009 | Nozawa et al. ............ 428/209 |
| 2005/0191580 | A1 | 9/2005 | Takahashi et al. |

FOREIGN PATENT DOCUMENTS

| CN | 101313249 A | 11/2008 |
| JP | 63-154714 | 6/1988 |
| JP | 4-345609 | 12/1992 |
| JP | 6-230212 | 8/1994 |
| JP | 2001-312053 | 11/2001 |
| JP | 2004-151618 | 5/2004 |
| JP | 2005-60515 | 3/2005 |
| JP | 2005-139363 | 6/2005 |
| JP | 2005-315984 | 11/2005 |
| WO | WO 2004/042474 A1 | 5/2004 |

OTHER PUBLICATIONS

U.S. Appl. No. 12/127,993, filed May 28, 2008, Ishizeki, et al.
U.S. Appl. No. 12/578,625, filed Oct. 14, 2009, Ishizeki, et al.
U.S. Appl. No. 12/627,099, filed Nov. 30, 2009, Takahashi, et al.
U.S. Appl. No. 12/627,727, filed Nov. 30, 2009, Ishizeki, et al.

* cited by examiner

*Primary Examiner* — John S Chu
(74) *Attorney, Agent, or Firm* — Oblon, Spivak, McClelland, Maier & Neustadt, L.L.P.

(57) ABSTRACT

To provide a fluorinated polymer which enables to reduce the amount of residual ink on partition walls and to form an ink layer having high uniformity in film thickness, and a negative photosensitive composition.

A fluorinated polymer which is a copolymer made of at least two monomers each having an ethylenic double bond, and which has a side chain having a $C_{20}$ or lower alkyl group in which at least one of its hydrogen atoms is substituted by a fluorine atom (provided that the alkyl group may contain an etheric oxygen atom between carbon atoms) and a side chain having at least two ethylenic double bonds per side chain.

10 Claims, No Drawings

FLUORINATED POLYMER, NEGATIVE PHOTOSENSITIVE RESIN COMPOSITION AND PARTITION WALLS

TECHNICAL FIELD

The present invention relates to a fluorinated polymer, a negative photosensitive resin composition and partition walls made thereof.

BACKGROUND ART

Heretofore, resist compositions have been used to prepare masks for production of circuits, such as semiconductor integrated circuits (IC) and thin film transistor (TFT) circuits for liquid crystal displays (LCD).

On the other hand, a resist composition has attracted attention also as a material to form a permanent film for e.g. partition walls between pixels of a color filter, partition walls for ITO electrodes of a liquid crystal display device, partition walls between pixels of an organic EL display device or partition walls of a circuit wiring substrate.

For example, in the production of a color filter, so-called an ink jet method has been proposed which employs an ink jet printing technique to jet and apply R (red), G (green) and B (blue) inks within fine pixels. Here, formation of a pixel pattern is carried out by photolithography using a resist composition, and a coating film cured product of the resist composition is utilized as partition walls between pixels.

Further, in the production of a liquid crystal display device, an ink jet method has been proposed wherein an ITO-containing fluid (solution or dispersion) is jetted and applied to form ITO (tin-doped indium oxide) electrodes, and formation of an ITO electrode pattern is carried out by photolithography using a resist composition, and a coating film cured product of the resist composition is utilized as partition walls.

Further, in the production of an organic EL display device, an ink jet method has been proposed wherein a solution of a hole transport material or a luminescent material is jetted and applied to form hole transport layers or luminescent layers within fine pixels. Here, formation of a pixel pattern is carried out by photolithography using a resist composition, and a coating film cured product of the resist composition is utilized as partition walls between pixels.

Further, in the production of a circuit wiring substrate, an ink jet method has been proposed wherein a metal dispersion is jetted and applied to form circuit wirings. Here, formation of a circuit wiring pattern is carried out by photolithography using a resist composition, and a coating film cured product of the resist composition is utilized as partition walls.

In the ink jet method, it is necessary to prevent e.g. color mixing of inks between adjacent pixels, or to prevent the ITO-containing fluid or the metal dispersion from attaching to or solidifying at portions other than the predetermined regions. Accordingly, the partition walls are required to have repellency against water or an organic solvent constituting the ink jet coating solution, i.e. a so-called water-and-oil repellency.

Patent Document 1: JP-A-2005-60515 (claim 1, Paragraphs [0029] and [0055])

Patent Document 2: JP-A-2005-315984 (claim 6, Paragraphs [0050] and [0053], Paragraph [0148])

DISCLOSURE OF THE INVENTION

Problems that the Invention is to Solve

If an ink was injected by an ink jet method into grooves (dots) between partition walls formed from the above-mentioned conventional composition, the ink dropped on the partition walls by displacement tended to stay on the partition walls without falling into the dots. Such a situation tends to lead color mixing of inks between the adjacent pixel regions. Further, the thickness of an ink layer formed between partition walls tended to be non-uniform. If a color filter or an organic EL display device was prepared by using such an ink layer, so-called edge leakage was likely to take place wherein the thickness of the ink layer in the vicinity of partition walls became thin, and the periphery of the partition walls looked white.

Usually, if the light exposure in an exposure step becomes high, it tends to be difficult to obtain high resolution, and therefore it is necessary to reduce the light exposure, but when partition walls were formed with low light exposure, ink residues on the partition walls or non-uniformity in thickness of the ink layer was particularly distinct.

Accordingly, it is an object of the present invention to provide a fluorinated polymer and a negative photosensitive composition capable of forming an ink layer having less ink residues on the partition walls and having high uniformity in thickness even when light exposure is low.

Means of Solving the Problems

The present inventors considered that in the case of a conventional fluorinated polymer having only one ethylenic double bond per side chain, if light exposure in the exposure step is low, there may be a case where some molecules may not be cured and may remain on the upper surface of the partition walls without being washed and removed from the system in the development step, whereby such non-reacted remaining molecules may migrate to dots from the partition walls to contaminate the dots in a subsequent heat step.

The present inventors considered that it is possible to solve problems of ink residues on partition walls or non-uniformity in thickness of the ink layer by suppressing such migration, and have arrived at the present invention by improving the curing reactivity of a fluorinated polymer.

The present invention provides a fluorinated polymer (A) which is a copolymer made of at least two monomers each having an ethylenic double bond, and which has a side chain having a $C_{20}$ or lower alkyl group in which at least one of its hydrogen atoms is substituted by a fluorine atom (provided that the alkyl group may contain an etheric oxygen atom between carbon atoms) and a side chain having at least two ethylenic double bonds per side chain.

Further, the present invention provides a fluorinated polymer (A) which is a copolymer made of at least two monomers each having an ethylenic double bond, which is formed by copolymerizing at least two monomers including a monomer having a $C_{20}$ or lower alkyl group in which at least one of its hydrogen atoms is substituted by a fluorine atom (provided that the alkyl group may contain an etheric oxygen atom between carbon atoms) and a monomer having a reactive group, followed by reacting an obtained copolymer with a compound having a functional group linkable with the reactive group and at least two ethylenic double bonds.

Further, the present invention provides a process for producing a fluorinated polymer (A) having a side chain having at least two ethylenic double bonds per side chain, which comprises copolymerizing at least two monomers including a monomer (a1) having a $C_{20}$ or lower alkyl group in which at least one of its hydrogen atoms is substituted by a fluorine atom (provided that the alkyl group may contain an etheric oxygen atom between carbon atoms) and a monomer (a2) having a reactive group, followed by reacting an obtained copolymer with a compound (z1) having a functional group linkable with the reactive group and at least two ethylenic double bonds.

Further, the present invention provides a negative photosensitive composition which is a composition comprising the above fluorinated polymer (A), a photosensitive resin (B) having an acidic group and at least two ethylenic double bonds per molecule and a photopolymerization initiator (C), wherein the proportion of the fluorinated polymer (A) is from 0.1 to 30 mass % based on the total solid content of the composition.

Further, the present invention provides a partition wall made of a coating film cured product of the above composition.

The negative photosensitive composition of the present invention is capable of forming a fine pattern and partition walls via a photolithography process. The above photolithography process comprises e.g. a prebake step of coating a substrate with the negative photosensitive composition of the present invention, followed by drying, an exposure step of carrying out exposure via a mask, a development step of removing a non-exposed portion by alkali development, and a step of rinsing to wash off e.g. a developer, followed by heating lastly.

The fluorinated polymer (A) contained in the negative photosensitive composition of the present invention has a side chain having a $C_{20}$ or lower alkyl group in which at least one of its hydrogen atoms is substituted by a fluorine atom, and it thus has a surface migration characteristic and will migrate to the vicinity of the coating film surface in the prebake step. Thus, water-and-oil repellency will be developed at the upper surface of partition walls formed of the coating film cured product. Further, the fluorinated polymer (A) has a side chain containing at least two ethylenic double bonds, whereby the curing reaction of the fluorinated polymer (A) is carried out sufficiently thereby to prevent unreacted remaining molecules from migrating to dots and contaminating them. Namely, the partition walls are excellent in water-and-oil repellency, the dots are excellent in water-and-oil affinity, and it is possible to improve the contrast of the water-and-oil repellency/water-and-oil affinity between the partition walls and the dots.

Accordingly, even when the dropped position of the ink is somewhat displaced onto partition walls at the time of injecting the ink into dots by an ink jet method, the dots are excellent in the water-and-oil affinity, whereby ink droplets are led to the dots and the ink tends to hardly remain on the partition walls. Namely, it is possible to inject ink into dots in high precision thereby to prevent the color mixing between pixels.

Further, since such dots are excellent in the water-and-oil affinity, the ink will uniformly spread within the dots, and the uniformity in thickness of the ink layer thereby formed will be high.

It is preferred that the fluorinated polymer (A) of the present invention has a side chain having an acidic group. A very small part of molecules of the fluorinated polymer (A) which are not cured in the exposure step, will readily be washed off from the surface of partition walls in the development step as such molecules have a side chain containing an acidic group, whereby residual molecules not fixed on the upper surface of partition walls tend to scarcely remain. It is thereby possible to further reduce molecules which otherwise migrate to dots in a heating step, such being effective to reduce ink residues on the partition walls and improve uniformity in thickness of the ink layer.

EFFECT OF THE INVENTION

The fluorinated polymer of the present invention is excellent in curing reactivity. When partition walls are formed by using a negative photosensitive composition containing the fluorinated polymer of the present invention, it is possible to reduce ink residues on the partition walls, which is injected by an ink jet method, and it is possible to prevent color mixing between the pixels. Further, it is possible to obtain an ink layer having high uniformity in thickness. Accordingly, the partition walls of the present invention are useful for e.g. partition walls between pixels of a color filter to be prepared by an ink jet method, for partition walls for ITO electrodes of a liquid crystal display device, for partition walls between pixels of an organic EL display device, or for partition walls of a circuit wiring substrate.

Since unreacted molecules are not likely to remain on the upper surface of the partition walls, no migration takes place over a long period after formation of a device, and it is thereby possible to avoid deterioration of the reliability of the device.

BEST MODE FOR CARRYING OUT THE INVENTION

In this specification, "(meth)acrylate" means an acrylate and/or a methacrylate. Likewise, "(meth)acrylic acid" means acrylic acid and/or methacrylic acid, "(meth)acrylamide" means acrylamide and/or methacrylamide, and "(meth)acryloyl group" means an acryloyl group and/or a methacryloyl group.

The fluorinated polymer (A) of the present invention is a copolymer made of at least two monomers each having an ethylenic double bond, and has a side chain having a $C_{20}$ or lower alkyl group in which at least one of its hydrogen atoms is substituted by a fluorine atom (provided that the alkyl group may contain an etheric oxygen atom between carbon atoms, hereinafter referred to as "the present fluoroalkyl group") and a side chain having at least two ethylenic double bonds per side chain.

The side chain having the present fluoroalkyl group may be formed directly by a polymerization reaction or may be formed by a chemical conversion after the polymerization reaction. Whereas, the side chain having at least two ethylenic double bonds per side chain may be formed by a chemical conversion after the polymerization reaction.

The present fluoroalkyl group may be linear or branched. As specific examples of the present fluoroalkyl group, the following structures may be mentioned.

$-CF_3$, $-CF_2CF_3$, $-CF_2CHF_2$, $-(CF_2)_2CF_3$, $-(CF_2)_3CF_3$, $-(CF_2)_4CF_3$, $-(CF_2)_5CF_3$, $(CF_2)_6CF_3$, $-(CF_2)_7CF_3$, $-(CF_2)_8CF_3$, $-(CF_2)_9CF_3$, $-(CF_2)_{11}CF_3$, $-(CF_2)_{15}CF_3$, $-CF(CF_3)O(CF_2)_5CF_3$, $-CF_2O(CF_2CF_2O)_pCF_3$ (p is an integer of from 1 to 8), $-CF(CF_3)O(CF_2CF(CF_3)O)_qC_6F_{13}$ (q is an integer of from 1 to 4) and $-CF(CF_3)O(CF_2CF(CF_3)O)_rC_3F_7$ (r is an integer of from 1 to 5).

The present fluoroalkyl group is preferably a perfluoroalkyl group, whereby the water-and-oil repellency will be good. Further, it is preferably a $C_{4-6}$ perfluoroalkyl group. In such a case, not only a sufficient water-and-oil repellency is imparted, but also the compatibility with another component constituting a negative photosensitive composition together with the fluorinated polymer (A) will be good, whereby when the composition is applied to form a coating film, no coagulation of the fluorinated polymer (A) tends to take place, and it becomes possible to form partition walls having a good outer appearance.

The ethylenic double bond may, for example, be an addition-polymerizable unsaturated group such as a (meth)acryloyl group, an allyl group, a vinyl group or a vinyl ether group. Some or all of hydrogen atoms of such a group may be substituted by a hydrocarbon group. As such a hydrocarbon group, a methyl group is preferred.

The fluorinated polymer (A) is preferably a polymer having a side chain further having an acidic group. It is thereby possible to increase the water-and-oil affinity of dots.

As the acidic group, at least one acidic group selected from the group consisting of a carboxyl group, a phenolic hydroxyl group and a sulfonic acid group is preferred.

The side chain containing an acidic group may be formed by the polymerization reaction of the monomer (a3) containing an acidic group or may be formed by a chemical conversion after the polymerization reaction.

The content of fluorine atoms in the fluorinated polymer (A) of the present invention is preferably from 5 to 35 mass %. As the content is high, the fluorinated polymer (A) will be excellent in the effect to lower the surface tension of partition walls made of a coating film cured product to be formed from a negative photosensitive composition, and a high water-and-oil repellency will be imparted to the partition walls. On the other hand, if the content is too high, the adhesion between the partition walls and the substrate tends to be low. The content of fluorine atoms in the fluorinated polymer (A) is more preferably such that the lower limit is 10 mass %, and the upper limit is 30 mass %.

The fluorinated polymer (A) preferably contains at least 2 and at most 100, more preferably at least 6 and at most 50, ethylenic double bonds per molecule. Within such a range, the fluorinated polymer (A) will have good developability and fixing property to partition walls.

The acid value of the fluorinated polymer (A) is preferably from 5 to 100 (mgKOH/g), more preferably from 10 to 50 (mgKOH/g). Within such a range, the residual molecules not fixed in the exposure step will be readily washed off from the partition walls in the development step. Here, the acid value is the mass (unit: mg) of potassium hydroxide required to neutralize 1 g of the resin, and in this specification, the unit is identified by mgKOH/g.

The number average molecular weight of the fluorinated polymer (A) is preferably at least 500 and less than 15,000, more preferably at least 1,000 and less than 10,000. Within such a range, the alkali solubility and the developability are good.

The fluorinated polymer (A) of the present invention can be prepared by copolymerizing at least two monomers including a monomer (a1) containing the present fluoroalkyl group and a monomer (a2) containing a reactive group and then reacting the obtained copolymer with a compound (z1) containing a functional group linkable with the above reactive group and at least two ethylenic double bonds.

A monomer represented by the formula 1 is preferred as the monomer (a1) containing the present fluoroalkyl group.

$$CH_2=C(R^1)COOXR^f \qquad \text{Formula 1}$$

In the formula, $R^1$ is a hydrogen atom, a methyl group or a trifluoromethyl group, X is a single bond or a $C_{1-8}$ bivalent organic group containing no fluorine atom, and $R^f$ is the present fluoroalkyl group.

In the above formula 1, X is preferably a $C_{2-4}$ alkylene group, from the viewpoint of the availability. Further, $R^f$ is preferably a perfluoroalkyl group, more preferably $C_{4-6}$ perfluoroalkyl group, whereby the compatibility with another component constituting a negative photosensitive composition together with the fluorinated polymer (A) will be excellent.

The following monomers may be mentioned as examples of the monomer represented by the above formula 1:

$$CH_2=C(R^1)COOR^2R^f$$

$$CH_2=C(R^1)COOR^2NR^3SO_2R^f$$

$$CH_2=C(R^1)COOR^2NR^3COR^f$$

$$CH_2=C(R^1)COOCH_2CH(OH)R^f$$

Here, $R^1$ is a hydrogen atom, a methyl group or a trifluoromethyl group, $R^2$ is a $C_{1-6}$ alkylene group, $R^3$ is a hydrogen atom or a methyl group, and $R^f$ is a fluoroalkyl group.

Specific examples for $R^2$ may, for example, be —$CH_2$—, —$CH_2CH_2$—, —$CH(CH_3)$—, —$CH_2CH_2CH_2$—, —$C(CH_3)_2$—, —$CH(CH_2CH_3)$—, —$CH_2CH_2CH_2CH_2$—, —$CH(CH_2CH_2CH_3)$—, —$CH_2(CH_2)_3CH_2$— and —$CH(CH_2CH(CH_3)_2)$—.

Specific examples of the monomer represented by the above formula 1 may, for example, be a perfluorohexylethyl (meth)acrylate and a perfluorobutylethyl (meth)acrylate.

Further, the above-mentioned monomers may be used alone or in combination as a mixture of two or more of them.

The monomer (a2) containing a reactive group may, for example, be a monomer containing a hydroxyl group, an acid anhydride monomer containing an ethylenic double bond, a monomer containing a carboxyl group or a monomer containing an epoxy group. Here, the monomer (a2) contains substantially no present fluoroalkyl group.

The reactive group of the monomer (a2) after the copolymerization will be reacted with the compound (z1) having a functional group linkable with the above reactive group and an ethylenic double bond, to form the fluorinated polymer (A) of the present invention having a side chain containing an ethylenic double bond.

Specific examples of the monomer containing a hydroxyl group may, for example, be 2-hydroxyethyl (meth)acrylate, 2-hydroxypropyl (meth)acrylate, 3-hydroxypropyl (meth)acrylate, 4-hydroxybutyl (meth)acrylate, 5-hydroxypentyl (meth)acrylate, 6-hydroxyhexyl (meth)acrylate, 4-hydroxycyclohexyl (meth)acrylate, neopentyl glycol mono(meth)acrylate, 3-chloro-2-hydroxypropyl (meth)acrylate, glycerol mono(meth)acrylate, 2-hydroxyethyl vinyl ether, 4-hydroxybutyl vinyl ether, cyclohexanediol monovinyl ether, 2-hydroxyethyl allyl ether, N-hydroxymethyl (meth)acrylamide and N,N-bis(hydroxymethyl) (meth)acrylamide. These monomers may be used alone or in combination as a mixture of two or more of them.

Further, the monomer containing a hydroxyl group may be a monomer having a polyoxyalkylene chain with a terminal hydroxyl group. It may, for example, be $CH_2=CHOCH_2C_6H_{10}CH_2O(C_2H_4O)_kH$ (wherein k is an integer of from 1 to 100, the same applies hereinafter), $CH_2=CHOC_4H_8O(C_2H_4O)_kH$, $CH_2=CHCOOC_2H_4O(C_2H_4O)_kH$, $CH_2=C(CH_3)COOC_2H_4O(C_2H_4O)_kH$ or $CH_2=CHCOOC_2H_4O(C_2H_4O)_m(C_3H_6O)_nH$ (wherein m is 0 or an integer of from 1 to 100, and n is an integer of from 1 to 100, provided that m+n is from 1 to 100, the same applies hereinafter), or $CH_2=C(CH_3)COOC_2H_4O(C_2H_4O)_m(C_3H_6O)_nH$. These monomers may be used alone or in combination as a mixture of two or more of them.

Specific examples of the acid anhydride monomer having an ethylenic double bond may, for example, be maleic anhydride, itaconic anhydride, citraconic anhydride, methyl-5-norbornene-2,3-dicarboxylic anhydride, 3,4,5,6-tetrahydrophthalic anhydride, cis-1,2,3,6-tetrahydrophthalic anhydride and 2-buten-1-yl succinic anhydride.

Specific examples of the monomer containing a carboxyl group may, for example, be acrylic acid, methacrylic acid, vinyl acetic acid, crotonic acid, itaconic acid, maleic acid, fumaric acid, cinnamic acid and their salts.

Specific examples of the monomer containing an epoxy group may, for example, be glycidyl (meth)acrylate and 3,4-epoxycyclohexylmethyl acrylate.

In the monomer (a3) having an acidic group, as a specific example of the monomer having a carboxyl group, acrylic acid, methacrylic acid, vinyl acetic acid, crotonic acid, itaconic acid, maleic acid, fumaric acid, cinnamic acid or salts thereof may be mentioned.

The monomer containing a phenolic hydroxyl group may, for example, be o-hydroxystyrene, m-hydroxystyrene or p-hydroxystyrene. Or, it may be a monomer having at least one hydrogen atom in such a benzene ring substituted by an alkyl group such as a methyl group, an ethyl group or a n-butyl group, an alkoxy group such as a methoxy group, an ethoxy group or a n-butoxy group, a halogen atom, a haloalkyl group having at least one hydrogen atom of an alkyl group substituted by a halogen atom, a nitro group, a cyano group or an amido group.

The monomer containing a sulfonic group may, for example, be vinyl sulfonic acid, styrene sulfonic acid, allyl sulfonic acid, methallyl sulfonic acid, 2-hydroxy-3-allyloxypropane sulfonic acid, 2-hydroxy-3-methallyloxypropane sulfonic acid, 2-sulfoethyl (meth)acrylate, 2-sulfopropyl (meth)acrylate, 2-hydroxy-3-(meth)acryloxypropane sulfonic acid or 2-(meth)acrylamide-2-methylpropane sulfonic acid.

The monomer to be used for the polymerization in the present invention may contain a monomer (a4) other than the monomer (a1) having the present fluoroalkyl group, the monomer (a2) having a reactive group and the monomer (a3) having an acidic group.

Such other monomer (a4) may, for example, be a hydrocarbon type olefin, a vinyl ether, an isopropenyl ether, an allyl ether, a vinyl ester, an allyl ester, a (meth)acrylate, a (meth)acrylamide, an aromatic vinyl compound, a chloroolefin or a conjugated diene. Such a compound may contain a functional group, and the functional group may, for example, be a carbonyl group or an alkoxy group.

Further, the above monomer may be used alone or in combination as a mixture of two or more of them. A (meth)acrylate or a (meth)acrylamide is particularly preferred, since the heat resistance of the partition walls formed from the composition will thereby be excellent.

The fluorinated polymer (A) of the present invention may be prepared, for example, by the following method. Firstly, the monomer is dissolved in a solvent and heated, and a polymerization initiator is added to carry out copolymerization to obtain a copolymer. In the copolymerization reaction, a chain transfer agent may preferably be present, as the case requires. The monomer, the polymerization initiator, the solvent and the chain transfer agent may continuously be added.

The above solvent may, for example, be an alcohol such as ethanol, 1-propanol, 2-propanol, 1-butanol or ethylene glycol; a ketone such as acetone, methyl isobutyl ketone or cyclohexanone; a cellosolve such as 2-methoxyethanol, 2-ethoxyethanol or 2-butoxyethanol; a carbitol such as 2-(2-methoxyethoxy)ethanol, 2-(2-ethoxyethoxy)ethanol or 2-(2-butoxyethoxy)ethanol; an ester such as methyl acetate, ethyl acetate, n-butyl acetate, ethyl lactate, n-butyl lactate, ethylene glycol monomethyl ether acetate, propylene glycol momomethyl ether acetate, ethylene glycol diacetate or glycerol triacetate; or an ether such as diethylene glycol dimethyl ether or diethylene glycol methylethyl ether.

As the polymerization initiator, a known organic peroxide, an inorganic peroxide, or an azo compound may, for example, be mentioned. The organic peroxide and the inorganic peroxide may be used in combination with a reducing agent in the form of a redox catalyst. These polymerization initiators may be used alone or in combination as a mixture of two or more of them.

The organic peroxide may, for example, be benzoyl peroxide, lauroyl peroxide, isobutyl peroxide, t-butyl hydroperoxide or t-butyl-α-cumyl peroxide. The inorganic peroxide may, for example, be ammonium persulfate, sodium persulfate, potassium persulfate, hydrogen peroxide or a percarbonate. The azo compound may, for example, be 2,2'-azobisisobutyronitrile, 1,1'-azobis(cyclohexane-1-carbonitrile), 2,2'-azobis(2,4-dimethylvaleronitrile), 2,2'-azobis(4-methoxy-2,4-dimethylvaleronitrile), dimethyl 2,2'-azobisisobutyrate or 2,2'-azobis(2-amidinopropane)dihydrochloride.

The chain transfer agent may, for example, be a mercaptan such as n-butylmercaptan, n-dodecylmercaptan, t-butylmercaptan, ethyl thioglycolate, 2-ethylhexyl thioglycolate or 2-mercaptoethanol; or an alkyl halide such as chloroform, carbon tetrachloride or carbon tetrabromide.

The copolymer obtained as described above is reacted with a compound (z1) having a functional group linkable with the reactive group and at least two ethylenic double bonds to obtain the fluorinated polymer (A).

The following combinations may, for example, be mentioned as a combination of the compound (z1) having a functional group linkable with a reactive group and at least two ethylenic double bonds, to the reactive group.

(1) An acid anhydride (z1) having at least two ethylenic double bonds, to a hydroxyl group.

(2) A compound (z1) having an isocyanate group and at least two ethylenic double bonds, to a hydroxyl group.

(3) A compound (z1) having an acyl chloride group and at least two ethylenic double bonds, to a hydroxyl group.

(4) A compound (z1) having a hydroxyl group and at least two ethylenic double bonds, to an acid anhydride.

(5) A compound (z1) having an epoxy group and at least two ethylenic double bonds, to a carboxyl group, and (6) A compound (z1) having a carboxyl group and at least two ethylenic double bonds, to an epoxy group.

From the viewpoint of reactivity, the combination of the above (2) is preferred.

As the compound (z1) having an isocyanate group and at least two ethylenic double bonds, the following may, for example, be mentioned. 1,1-bis((meth)acryloyloxymethyl) ethyl isocyanate. A reaction product of a compound having at least two (meth)acryloyloxy groups and a hydroxyl group with a diisocyanate at a ratio of 1:1. As the compound having at least two (meth)acryloyloxy groups and a hydroxyl group, dipentaerythritol penta(meth)acrylate, pentaerythritol tri (meth)acrylate, ditrimethylolpropane tetra(meth)acrylate or glycerol 1,3-dimethacrylate may be mentioned. As a diisocyanate, isophorone diisocyanate, hexamethylene diisocyanate, tolylene-2,4-diisocyanate, 1,3-phenylene diisocyanate, diphenylmethane diisocyanate or 4,4'-diphenylmethane diisocyanate may be mentioned.

The compound (z1) having a hydroxyl group and at least two ethylenic double bonds may, for example, be pentaerythritol tri(meth)acrylate, ditrimethylolpropane tetra(meth) acrylate, dipentaerythritol penta(meth)acrylate or glycerol 1,3-dimethacrylate.

At the time of reacting a copolymer with the compound (z1) having a functional group linkable with the reactive group and at least two ethylenic double bonds, as a solvent to be used for the reaction, it is possible to use the above solvent exemplified in the preparation of a copolymer.

Further, a polymerization inhibitor may preferably be blended. As such a polymerization inhibitor, a conventional polymerization inhibitor may be used, and specifically, 2,6-di-t-butyl-p-cresol may be mentioned.

Further, a catalyst or a neutralizing agent may be added. For example, in a case where a copolymer having a hydroxyl group is to be reacted with a compound having an isocyanate group and ethylenic double bonds, a tin compound or the like may be used. The tin compound may, for example, be dibutyltin dilaurate, dibutyltin di(maleic acid monoester), dioctyltin dilaurate, dioctyltin di(maleic acid monoester) or dibutyltin diacetate.

The preferred proportion of each monomer based on the total mass of monomers to be copolymerized is as follows. The proportion of the monomer (a1) having the present fluoroalkyl group is preferably from 20 to 80 mass %, more preferably from 30 to 60 mass %. As the proportion is high, the fluorinated polymer (A) of the present invention will be excellent in the effect to lower the surface tension of the partition walls made of a coating film cured product to be formed, and a high water-and-oil repellency will be imparted to the partition walls. On the other hand, if the proportion is too high, the adhesion between the partition walls and the substrate tends to be low. The proportion of the monomer (a2) having a reactive group is preferably from 20 to 70 mass %, more preferably from 30 to 50 mass %. Within such a range, the fluorinated polymer (A) will have good developability and fixing property to partition walls. The proportion of the monomer (a3) having an acidic group is preferably from 2 to 20 mass %, more preferably from 4 to 12 mass %. Within such a range, the residual molecules not fixed in the exposure step will be readily washed off from the partition walls in the development step. The proportion of such other monomer (a4) is preferably at most 70 mass %, more preferably at most 50 mass %. When the proportion is within such a range, the alkali solubility and the developability will be good.

It is preferred that the copolymer and the compound (z1) are charged so that the equivalent ratio of [functional group of the compound (z1)]/[reactive group of the copolymer] would be from 0.5 to 2.0. As the equivalent ratio is high, the fluorinated polymer (A) will have good fixing property to partition walls. On the other hand, if the equivalent ratio is too high, an impurity as an unreacted compound (z1) increases, whereby the appearance of a coating film will be deteriorated. Such a ratio is more preferably from 0.8 to 1.5. Further, in a case where a monomer having a carboxyl group is used for both of the monomer (a2) having a reactive group and the monomer (a3) having an acidic group, the amounts of the copolymer and the compound (z1) to be charged may be adjusted so as to have an aimed acid value.

The proportion of the fluorinated polymer (A) based on the total solid content of the negative photosensitive composition is preferably from 0.1 to 30 mass %. When such a proportion is high, the fluorinated polymer (A) will be excellent in the effect to lower the surface tension of the partition walls to be formed, and a high water-and-oil repellency will be imparted to the partition walls. On the other hand, if the proportion is too high, the adhesion between the partition walls and the substrate tends to be low. The proportion of the fluorinated polymer (A) in the total solid content of the composition is preferably such that the lower limit is 0.15 mass %, and the upper limit is 20 mass %. Especially, when the lower limit is at least 0.25 mass %, the partition walls are excellent in the oil and water repellency.

The negative photosensitive composition of the present invention preferably contains the photosensitive resin (B) having an acidic group and an ethylenic double bond per molecule. The photosensitive resin (B) has the acidic group, whereby a non-exposed portion is removed with an alkaline developer. Further, the photosensitive resin (B) has the ethylenic double bond, whereby an exposed portion is not removed with an alkaline developer. Accordingly, it is possible to form partition walls. It is preferred that the photosensitive resin (B) contains substantially no fluoroalkyl groups.

The acidic group may be at least one acidic group selected from the group consisting of a carboxyl group, a phenolic hydroxyl group, a sulfonic group and a phosphoric group. The ethylenic double bond may, for example, be an addition-polymerizable unsaturated group such as a (meth)acryloyl group, an allyl group, a vinyl group or a vinyl ether group. Some or all of hydrogen atoms of such a group may be substituted by a hydrocarbon group. As such a hydrocarbon group, a methyl group is preferred.

The photosensitive resin (B) may, for example, be a copolymer made of monomers each having an ethylenic double bond, which is a polymer (B-1) having a side chain containing an acidic group and a side chain containing an ethylenic double bond or an epoxy resin (B-2) having an acidic group and an ethylenic double bond introduced therein.

It is possible to produce the above polymer (B-1) in the same manner as in the above fluorinated polymer (A) except that no monomer (a1) having the present fluoroalkyl group is used. As an ethylenic unsaturated monomer having a phosphoric group, 2-(meth)acryloyloxyethane phosphoric acid may be mentioned. In the production of the polymer (B-1), as a compound having a functional group linkable with a reactive group and an ethylenic double bond, it is possible to use e.g. 2-(meth)acryloyloxyethyl isocyanate, (meth)acryloyl chloride, glycidyl (meth)acrylate or 3,4-epoxycyclohexyl methylacrylate.

An epoxy resin skeleton of the above epoxy resin (B-2) may, for example, be a bisphenol A type resin, a bisphenol F type epoxy resin, a phenol novolac type epoxy resin, a cresol novolac type epoxy resin, a trisphenolmethane type epoxy resin, an epoxy resin having a naphthalene skeleton, an epoxy resin having a biphenyl skeleton represented by the following formula 2 (provided that s represents from 2 to 50) or an epoxy resin represented by the following formula 3 (provided that $R^7$, $R^8$, $R^9$ and $R^{10}$ are each independently a hydrogen atom, a chlorine atom or any one of $C_{1-5}$ alkyl groups, and t represents from 0 to 10).

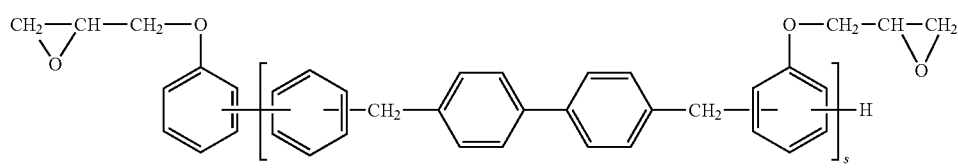

Formula 2

Formula 3

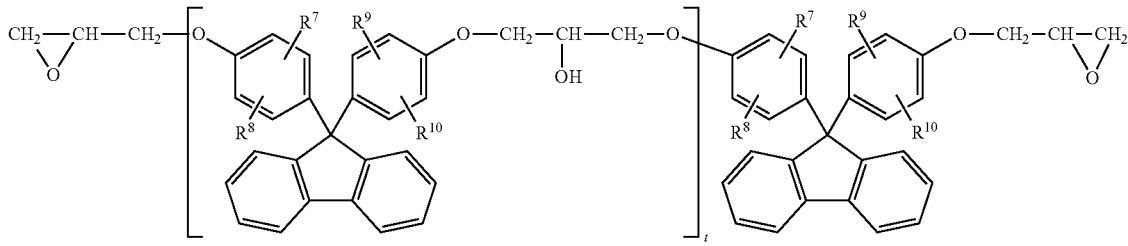

As a method for introducing an ethylenic double bond to an epoxy resin, a method may, for example, be mentioned wherein a compound having a carboxyl group and an ethylenic double bond is reacted with an epoxy group in the epoxy resin. Further, by reacting an acid anhydride with hydroxyl groups formed by the reaction of such an epoxy group and a carboxyl group, it is possible to introduce the carboxyl group as an acidic group. Especially, in a case where the compound having a carboxyl group and an ethylenic double bond is reacted with an epoxy group in the epoxy resin represented by the formula 3, and then an acid anhydride is reacted therewith, it is preferred to react a mixture of dicarboxylic anhydride and tetracarboxylic dianhydride. It is thereby possible to control a molecular weight by changing the ratio of dicarboxylic anhydride and tetracarboxylic dianhydride.

Commercial products of the epoxy resin (B-2) having an acidic group and an ethylenic double bond introduced may, for example, be KAYARAD PCR-1069, K-48C, CCR-1105, CCR-1115, CCR-1163H, CCR-1166H, CCR-1159H, TCR-1025, TCR-1064, TCR-1286, ZAR-1535, ZFR-1122, ZFR-1124, ZFR-1185, ZFR-1492, ZCR-1571H, ZCR1569H, ZCR-1580H, ZCR1581H and ZCR1588H (all manufactured by Nippon Kayaku Co., Ltd.).

The photosensitive resin (B) preferably has at least three ethylenic double bonds per molecule, more preferably at least six ethylenic double bonds per molecule. It is thereby possible to readily make a difference in alkali solubility between an exposed portion and a non-exposed portion, and it becomes possible to form a fine pattern with less exposure.

The photosensitive resin (B) preferably has a carboxyl group and/or a hydroxyl group as a crosslinkable group. In a case where the negative photosensitive composition of the present invention further contains a heat crosslinking agent (E) which is a compound having at least two groups reactive with a carboxyl group and/or a hydroxyl group, such a compound undergoes a crosslinking reaction with the photosensitive resin (B) by heat treatment after the development, whereby the crosslinked density of the coating film will increase, and the heat resistance will be improved. The carboxyl group or the phenolic hydroxyl group as an acidic group is also a crosslinkable group. In a case where the photosensitive resin (B) has a sulfonic acid group or a phosphoric acid group, as an acidic group, it is preferred to have at least one of a carboxyl group, a phenolic hydroxyl group and an alcoholic hydroxyl group, as a crosslinkable group.

The acid value of the photosensitive resin (B) is preferably from 10 to 300 mgKOH/g, more preferably from 30 to 150 mgKOH/g. Within such a range, the developability of the negative photosensitive composition will be good.

The number average molecular weight of the photosensitive resin (B) is preferably at least 500 and less than 20,000, more preferably at least 2,000 and less than 15,000. Within such a range, the alkali solubility and the developability will be good.

The proportion of the photosensitive resin (B) based on the total solid content of the composition is preferably from 5 to 80 mass %, more preferably from 10 to 60 mass %. Within such a range, the developability of the negative photosensitive composition will be good.

In the present invention, the negative photosensitive composition preferably contains a photopolymerization initiator (C). The photopolymerization initiator (C) is preferably made of a compound which emits radicals by light.

The photopolymerization initiator (C) may, for example, be an α-diketone such as benzyl, diacetyl, methylphenylglyoxylate or 9,10-phenanthrenequinone; an acyloin such as benzoin; an acyloin ether such as benzoin methyl ether, benzoin ethyl ether or benzoin isopropyl ether; a thioxanthone such as thioxanthone, 2-chlorothioxanthone, 2-methylthioxanthone, 2,4-dimethylthioxanthone, isopropylthioxanthone, 2,4-diethylthioxanthone, 2,4-dichlorothioxanthone, 2,4-diisopropylthioxanthone or thioxanthone-4-sulfonic acid; a benzophenone such as benzophenone, 4,4'-bis(dimethylamino)benzophenone or 4,4'-bis(diethylamino)benzophenone; an acetophenone such as acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-[4-(methylthio)phenyl]-2-morpholino-1-propanone, or 2-benzyl-2-dimethylamino-1-(4-morpholinophenyl)-butan-1-one; a quinone such as anthraquinone, 2-ethylanthraquinone, camphorquinone or 1,4-naphthoquinone; an aminobenzoate such as ethyl 2-dimethylaminobenzoate, ethyl 4-dimethylaminobenzoate, (n-butoxy)ethyl 4-dimethylaminobenzoate, isoamyl 4-dimethylaminobenzoate or 2-ethylhexyl 4-dimethylaminobenzoate; a halogenated compound such as phenacyl chloride or trihalomethyl phenyl sulfone; an acylphosphine oxide; a peroxide such as di-t-butylperoxide; or an oxime ester such as 1,2-octanedione, 1-[4-(phenylthio)-, 2-(o-benzoyloxime) or ethanone 1-[9-ethyl-6-(2-methylbenzoyl)-9H-carbazoyl-3-yl]-1-(o-acetyloxime).

Particularly, the above-mentioned benzophenone, aminobenzoate or the like may be used together with a radical initiator to exhibit a sensitizing effect. Further, an aliphatic amine such as triethanolamine, methyldiethanolamine, triisopropanolamine, n-butylamine, N-methyldiethanolamine or diethylaminoethyl methacrylate may likewise be used together with a radical initiator to exhibit a sensitizing effect.

The proportion of the photopolymerization initiator (C) based on the total solid content of the negative photosensitive composition is preferably from 0.1 to 50 mass %, more preferably from 0.5 to 30 mass %. Within such a range, the developability of the negative photosensitive composition will be good.

It is preferred that the negative photosensitive composition further contains a radical crosslinking agent (D) having at least two ethylenic double bonds and no acidic groups, whereby the photocurability of the negative photosensitive composition further improves, and the formation of partition walls with low exposure is accelerated.

As a specific example of the radical crosslinking agent (D), diethylene glycol di(meth)acrylate, tetraethylene glycol di(meth)acrylate, tripropylene glycol di(meth)acrylate, neopentyl glycol di(meth)acrylate, 1,9-nonanediol di(meth)acrylate, trimethylolpropane tri(meth)acrylate, pentaerythritol tri(meth)acrylate, pentaerythritol tetra(meth)acrylate, ditrimethylolpropane tetra(meth)acrylate or dipentaerythritol hexa(meth)acrylate may be mentioned. Further, urethane acrylate may also be mentioned. They may be used alone, or two or more of them may be used in combination.

The proportion of the radical crosslinking agent (D) based on the total solid content of the negative photosensitive composition is preferably from 10 to 60 mass %, more preferably from 15 to 50 mass %. Within such a range, the developability of the negative photosensitive composition will be good.

It is preferred that the negative photosensitive composition further contains a heat crosslinking agent (E) as a compound having at least two groups reactive with a carboxyl group and/or a hydroxyl group. In a case where the photosensitive resin (B) has a carboxyl group and/or a hydroxyl group, the heat crosslinking agent (E) is reacted with the photosensitive resin (B), whereby it is possible to increase the crosslinked density of the coating film cured product and improve the heat resistance.

The heat crosslinking agent (E) is preferably at least one member selected from the group consisting of an amino resin, an epoxy compound, an oxazoline compound, a polyisocyanate compound and a polycarbodiimide compound. Such a compound may be used alone, or two or more of them may be used in combination.

The amino resin may be a compound having some or all of amino groups of e.g. a melamine compound, a guanamine compound or a urea compound hydroxymethylated, or a compound having some or all of hydroxyl groups of such a hydroxymethylated compound etherified with methanol, ethanol, n-butyl alcohol, 2-methyl-1-propanol or the like, such as hexamethoxymethylmelamine.

The epoxy compound may, for example, be a glycidyl ether such as a bisphenol A type epoxy resin, a bisphenol F type epoxy resin, a phenol/novolac type epoxy resin, a cresol/novolac type epoxy resin, a trisphenolmethane type epoxy resin or a brominated epoxy resin, an alicyclic epoxy resin such as 3,4-epoxycyclohexylmethyl-3,4-epoxycyclohexanecarboxylate or bis(2,3-epoxycyclopentyl)ether, a glycidyl ester such as diglycidyl hexahydrophthalate, diglycidyl tetrahydrophthalate or diglycidyl phthalate, a glycidylamine such as tetraglycidyldiaminodiphenylmethane or triglycidyl paraminophenol, or a heterocyclic epoxy resin such as triglycidyl isocyanurate.

The oxazoline compound may, for example, be a copolymer of a polymerizable monomer such as 2-vinyl-2-oxazoline, 2-vinyl-4-methyl-2-oxazoline, 2-vinyl-5-methyl-2-oxazoline, 2-isopropenyl-2-oxazoline or 2-isopropenyl-4-methyl-2-oxazoline.

The polyisocyanate compound may, for example, be a polyisocyanate compound such as hexamethylene diisocyanate or isophorone diisocyanate, a silylisocyanate compound such as methylsilyl triisocyanate, and/or condensates or oligomers thereof, or a blocked polyisocyanate compound having the isocyanate groups blocked with a blocking agent such as a phenol.

The polycarbodiimide compound may be obtained by a de-carbon dioxide condensation reaction of a known organic diisocyanate. At that time, a phosphate compound such as trimethyl phosphate or triethyl phosphate may be used as a known catalyst. Further, by using a mixture of an organic diisocyanate and a hydroxyl group-containing polyethylene glycol, a nonionic hydrophilic polycarbodiimide compound may be obtained.

The proportion of the heat crosslinking agent (E) based on the total content of the negative photosensitive composition is preferably from 1 to 50 mass %, more preferably from 5 to 30 mass %. Within such a range, the developability of the negative photosensitive composition will be good.

It is preferred that the negative photosensitive composition contains a silane coupling agent (F) as the case requires. In the case of using a silane coupling agent, the adhesion to the substrate of a coating film cured product formed from the composition is improved.

Specific examples of the silane coupling agent (F) include tetraethoxysilane, 3-glycidoxypropyl trimethoxysilane, methyltrimethoxysilane, vinyltrimethoxysilane, 3-methacryloxypropyltrimethoxysilane, 3-chloropropyltrimethoxysilane, 3-mercaptopropyltrimethoxysilane, 3-aminopropyltrimethoxysilane, heptadecafluorooctylethyltrimethoxysilane, and a polyoxyalkylene chain-containing triethoxysilane. They may be used alone or two or more of them may be used in combination.

In the negative photosensitive composition, a diluting agent (G) may be used. As a specific example of the diluting agent (G), a solvent exemplified as a solvent for synthesizing the fluorinated resin (A) may be mentioned. As other examples, a chain hydrocarbon such as n-butane or n-hexane, a cyclic saturated hydrocarbon such as cyclohexane, and an aromatic hydrocarbon such as toluene, xylene or benzyl alcohol may, for example, be mentioned. They may be used alone or two or more of them may be used in combination.

Further, in the negative photosensitive composition of the present invention, a colorant (H) may be used as the case requires, whereby partition walls may be colored.

In a black photosensitive colorant composition to form a black matrix, it is possible to use, for example, carbon black, aniline black, anthraquinone black pigment or perylene black pigment, e.g. specifically, C. I. Pigment Black 1, 6, 7, 12, 20 or 31. In the black photosensitive colorant composition, it is also possible to use a mixture of organic or inorganic pigments of e.g. red, blue and green pigments. As a black pigment, carbon black is preferred from the viewpoint of the price and good shielding property. Such carbon black may be surface-treated with e.g. a resin. Further, in order to adjust the color tone, a blue pigment or a purple pigment may be used in combination for the black photosensitive colorant composition.

The carbon black is preferably one having a specific surface area of from 50 to 200 $m^2/g$ as measured by BET method, from the viewpoint of the black matrix shape. If carbon black having a specific surface area of less than 50 $m^2/g$ is used, deterioration of the black matrix shape is likely to result, and if carbon black having a specific surface area exceeding 200 $m^2/g$ is used, a dispersing agent is likely to be excessively adsorbed on the carbon black, whereby it will be required to incorporate a large amount of a dispersing agent in order to obtain various physical properties.

Further, the carbon black is preferably one having dibutyl phthalate oil absorption of at most 120 cc/100 g from the viewpoint of the sensitivity. The smaller the oil absorption, the better.

Further, the average primary particle size of carbon black is preferably from 20 to 50 nm as observed by a transmission electron microscope. If the average primary particle size is too small, it tends to be difficult to disperse it at a high concentration and to obtain a photosensitive black composition having good stability with time. If the average primary particle size is too large, deterioration of the black matrix shape is likely to result.

As the red pigment, it is possible to employ, for example, C. I. Pigment Red 7, 9, 14, 41, 48:1, 48:2, 48:3, 48:4, 81:1, 81:2, 81:3, 97, 122, 123, 146, 149, 168, 177, 178, 179, 180, 184, 185, 187, 192, 200, 202, 208, 210, 215, 216, 217, 220, 223, 224, 226, 227, 228, 240, 246, 254, 255, 264, 272 or 279.

As the blue pigment, it is possible to employ, for example, C. I. Pigment Blue 15, 15:1, 15:2, 15:3, 15:4, 15:6, 16, 22, 60, 64 or 80.

As the green pigment, it is possible to employ, for example, C. I. Pigment Green 7 or 36.

To the negative photosensitive composition, a curing accelerator, a thickener, a plasticizer, a defoaming agent, a leveling agent, an anti-repellent, an ultraviolet absorber, etc. may be incorporated, as the case requires.

Further, the negative photosensitive composition may contain a copolymer made of at least two monomers each having an ethylenic double bond, which is a silicon-containing polymer having a side chain having a silicone group, represented by the following formula 4 and a side chain having an ethylenic double bond. It is possible to improve ink falling property from partition walls made of a coating film cured product of the composition.

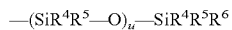

—(SiR$^4$R$^5$—O)$_u$—SiR$^4$R$^5$R$^6$  Formula 4

In the formula, each of R$^4$ and R$^5$ is independently a hydrogen atom, an alkyl group, a cycloalkyl group or an aryl group, R$^6$ is a hydrogen atom or a C$_{1-10}$ organic group, and u is an integer of from 1 to 200. A specific example of the above silicon-containing polymer includes the resin (A3-1), the resin (A3-2) and the resin (A3-3) described in Table 2 on page 38 in WO2004/079454 pamphlet.

Now, a photolithography process using the negative photosensitive composition of the present invention will be mentioned.

(Coating Step) Firstly, the composition of the present invention is applied on a substrate. As the substrate, its material is not particularly limited, but it may, for example, be various types of glass sheets, a polyester such as polyethylene terephthalate, a polyolefin such as polypropylene or polyethylene, a thermoplastic sheet such as polycarbonate, polymethyl methacrylate, polysulfone or polyimide or poly(meth)acryl resin, or a thermosetting plastic sheet such as an epoxy resin or a polyester resin. Especially, from the viewpoint of the heat resistance, a glass sheet or a heat resistant plastic such as polyimide is preferably employed.

The coating film-forming method may, for example, be a spraying method, a roll coating method, a spin coating method or a bar-coating method.

(Prebake Step) Then, the coating film is dried. By the drying, the solvent will evaporate, whereby a coating film having no fluidity will be obtained. The conditions for the drying vary depending upon the types of the respective components, the blend proportions, etc., but preferably within wide ranges of from 50 to 120° C. for from about 10 to 2,000 seconds.

(Exposure Step) Then, the coating film after heating is subjected to exposure via a mask having a prescribed pattern. The light to be irradiated may, for example, be visible light, ultraviolet rays, far ultraviolet rays, an excimer laser such as KrF excimer laser, ArF excimer laser, F$_2$ excimer laser, Kr$_2$ excimer laser, KrAr excimer laser or Ar$_2$ excimer laser, X-rays or electron beams. It is preferably light having a wavelength of from 100 to 600 nm, more preferably electromagnetic waves having a distribution within a range of from 300 to 500 nm, particularly preferably i-line (365 nm), h-line (405 nm) or g-line (436 nm). As an irradiation device, a known super high pressure mercury lamp or the like may, for example, be used. Light exposure is preferably within a range of from 5 to 1,000 mJ/cm$^2$, more preferably from 50 to 400 mJ/cm$^2$. If the light exposure is too low, curing of partition walls tends to be inadequate, and in the subsequent phenomenon, dissolution or peeling is likely to occur, such being undesirable. If the light exposure is too high, it tends to be difficult to obtain a high resolution.

(Development Step) Thereafter, development is carried out by a developer to remove a non-exposed portion. As such a developer, it is possible to employ an aqueous alkali solution which is made of an alkali, such as an inorganic alkali, an amine, an alcoholamine or a quaternary ammonium salt.

The developing time is preferably from 30 to 180 seconds. Further, the developing method may be any method such as a dipping method or a paddle method. After the development, washing with water is carried out, followed by drying with compressed air or compressed nitrogen to remove moisture on the substrate.

(Heating Step) Then, heat treatment is carried out by a heating device such as a hot plate or an oven, preferably at from 120 to 250° C. for from 5 to 90 minutes, whereby a pattern made of dots between partition walls will be formed.

It is possible to use the negative photosensitive composition of the present invention for pattern formation having a width of a partition wall of preferably at most 100 μm, more preferably at most 20 μm in average. Further, it is possible to use the composition for pattern formation having a distance (width of a dot) between adjacent partition walls of preferably at most 300 μm, more preferably at most 100 μm in average. Further, it is possible to use it for pattern formation having a height of partition walls of preferably from 0.05 to 50 μm, more preferably from 0.2 to 10 μm in average.

The water-and-oil repellency of a coating film cured product formed from a negative photosensitive composition can be estimated by the contact angle of water and xylene, and the contact angle of water is preferably at least 90°, more preferably at least 95°. Further, the contact angle of xylene is preferably at least 35°, more preferably at least 40°.

By using the partition walls of the present invention, it is possible to obtain a color filter or an organic EL display device.

(Production of Color Filter) In a case where a color filter is to be formed by using the partition walls obtained by the present invention, after forming partition walls by the above photolithography process, pixels are formed within dots between the partition walls, by means of an ink jet method.

The ink jet apparatus to be used for forming such pixels is not particularly limited, but it is possible to use an ink jet apparatus employing various methods, such as a method of continuously jetting an electrified ink and controlling it by a magnetic field, a method of periodically spraying an ink by using piezoelectric elements, a method of heating ink and intermittently jetting it by utilizing its foaming.

Further, the shape of pixels to be formed may be of any known configuration such as a stripe type, a mosaic type, a triangle type or a 4-pixel configuration type.

The ink to be used for forming pixels, mainly comprises a coloring component, a binder resin component and a solvent component.

A water-base ink comprises, as a solvent, water and, if necessary, a water-soluble organic solvent, and as a binder resin component, a water-soluble or water-dispersible resin, and it contains various additives as the case requires.

Whereas, an oil-base ink comprises an organic solvent as the solvent and a resin soluble in the organic solvent, as the binder resin component, and it contains various additives as the case requires.

As the coloring component, it is preferred to employ a pigment or dye excellent in heat resistance, light resistance, etc.

As the binder resin component, a transparent resin excellent in heat resistance is preferred, such as an acrylic resin, a melamine resin or an urethane resin, but it is by no means restricted thereto.

Further, after injecting ink by an ink jet method, if required, it is preferred to carry out a drying step, a heat-curing step or an ultraviolet ray-curing step.

After forming pixels, an overcoat layer may be formed as the case requires. It is preferred that such an overcoat layer is formed for the purpose of improving the surface flatness and for the purpose of preventing an eluent from the ink at partition walls or pixels from reaching to the liquid crystal layer. In a case where such an overcoat layer is to be formed, it is preferred to preliminarily remove the liquid repellency of the partition walls. In a case where the liquid repellency is not removed, the overcoating liquid will be repelled, and a uniform film thickness tends to be hardly obtainable, such being undesirable. The method for removing the liquid repellency of partition walls may, for example, be plasma ashing treatment or optical ashing treatment.

Further, as the case requires, it is preferred to form a photospacer on the black matrix to improve the product quality of the liquid crystal panel to be produced by using a color filter.

(Production of Organic EL Display Device) In a case where an organic EL display device is to be formed by using the partition walls of the present invention, firstly, a transparent electrode of e.g. indium tin oxide is formed by e.g. a sputtering method on a transparent substrate of e.g. glass, and if necessary, the transparent electrode is etched to have a desired pattern. Then, partition walls of the present invention will be formed by the photolithography process. Then, by using an ink jet method, the solutions of a hole transport material and a luminescent material are sequentially applied within dots between the partition walls and dried, to form a hole transport layer and a luminescent layer. Then, an electrode of e.g. aluminum is formed by e.g. a vapor deposition method, whereby pixels for an organic EL display device will be obtained.

EXAMPLES

Now, the present invention will be described with reference to Examples of the present invention (Examples 1 to 4 and 6 to 12) and Comparative Examples (Examples 5 and 13 to 15), but it should be understood that the present invention is by no means restricted thereto. In the following, "parts" are based on mass, unless otherwise specified.

The number average molecular weight is a value measured by a gel permeation chromatography method using polystyrene as the standard substance.

The content of a fluorine atom was measured by the following method. An obtained fluorinated polymer (A) was completely burned and decomposed at 1,200° C., and the generated gas was absorbed in 50 g of water. The amount of fluoride ions in the obtained aqueous solution was quantified, and the content of fluorine atoms contained in the fluorinated polymer (A) was calculated.

The acid value (mgKOH/g) and the number of ethylenic double bonds per molecule, are theoretical values calculated from the blend proportions of monomers as the raw materials.

Abbreviations of compounds used in the following respective Example will be shown.

C4FMA: $CH_2=C(CH_3)COOCH_2CH_2(CF_2)_4F$,
C6FMA: $CH_2=C(CH_3)COOCH_2CH_2(CF_2)_6F$,
MAA: Methacrylic acid,
2-HEMA: 2-Hydroxyethyl methacrylate,
CHMA: Cyclohexyl methacrylate,
MMA: Methyl methacrylate,
IBMA: Isobornyl methacrylate,
V-70: 2,2'-Azobis(4-methoxy-2,4-dimethylvaleronitrile) (tradename: V-70, manufactured by Wako Pure Chemical Industries, Ltd.),
2-ME: 2-Mercaptoethanol,
BEI: 1,1-Bis(acryloyloxymethyl)ethyl isocyanate (tradename: Karenz BEI, manufactured by Showa Denko K.K.),
AOI: Acryloyl oxyethyl isocyanate (tradename: Karenz AOI, manufactured by Showa Denko K.K.),
DBTDL: Dibutyltin dilaurate,
BHT: 2,6-Di-t-butyl-p-cresol,
IR907: Radical initiator (tradename: IRGACURE-907, manufactured by Ciba Geigy),
OXE01: 1,2-Octanedione 1-[4-(phenylthio)-,2-(o-benzoyloxime)] (tradename: OXE01, manufactured by Ciba Specialty Chemicals K.K.),
OXE02: Ethanone 1-[9-ethyl-6-(2-methylbenzoyl)-9H-carbazoyl-3-yl]-1-(o-acetyloxime) (tradename: OXE02, manufactured by Ciba Specialty Chemicals K.K.),
DEAB: 4,4'-Bis(diethylamino)benzophenone,
DETX-S: Isopropylthioxanthone (tradename: DETX-S, manufactured by Nippon Kayaku Co., Ltd.),
CCR1115: Cresol novolac type epoxyacrylate (tradename: CCR-1115, solid content: 60 mass %, manufactured by Nippon Kayaku Co., Ltd.),
ZFR1492H: bisphenol F-type epoxyacrylate (manufactured by NIPPON KAYAKU CO., LTD., tradename: ZFR-1492H; solid content: 65 mass %),
D310: Dipentaerythritol pentaacrylate (tradename: KAYARAD D-310, manufactured by Nippon Kayaku Co., Ltd.),
157S65: Bisphenol A novolac type (tradename: Epikote 157S65, manufactured by Japan Epoxy Resins Co., Ltd.),
KBM403: 3-Glycidoxypropyltrimethoxysilane (tradename: KBM-403, manufactured by Shin-Etsu Chemical Co., Ltd.),
DEGDM: Diethylene glycol dimethyl ether,
CB: Carbon black (average particle size: 120 nm (secondary particle size), propylene glycol monomethyl ether acetate solution, CB content: 20 mass %, solid content: 25 mass %).

Example 1

Preparation of Fluorinated Polymer (A-1)

(Copolymerization)

Into an autoclave having an internal capacity of 1 L and equipped with a stirrer, acetone (556.0 g), C6FMA (96.0 g), MAA (28.8 g), 2-HEMA (96.0 g), IBMA (19.2 g), chain transfer agent 2-ME (7.8 g) and polymerization initiator V-70 (3.6 g) were charged, and polymerized at 40° C. for 18 hours with stirring in a nitrogen atmosphere to obtain a solution of copolymer 1. The solution was subjected to gas chromatography analysis, and the remaining proportions of respective monomers were determined. The conversions of the respective monomers were such that C6FMA was 86%, MAA was 87%, 2-HEMA was 91% and IBMA was 83%. To the obtained acetone solution of copolymer 1, water was added for reprecipitation for purification, and then, reprecipitation for purification was carried out by means of petroleum ether, followed by vacuum drying to obtain 239 g of copolymer 1. The number average molecular weight was 2,320.

(Introduction of Ethylenic Double Bond)

Into a glass flask having an internal capacity of 300 mL and equipped with a thermometer, a stirrer and a heating device, the copolymer 1 (100 g), BEI (76.3 g), DBTDL (0.31 g), BHT (3.8 g) and acetone (100 g) were charged and reacted at 30° C. for 48 hours with stirring to obtain a solution of the fluorinated polymer (A-1). To the obtained acetone solution of fluorinated polymer (A-1), water was added for reprecipitation for purification, and then, reprecipitation for purification was carried out by means of petroleum ether, followed by vacuum drying to obtain 182 g of fluorinated polymer (A-1). The number average molecular weight was 4,300. The fluorinated polymer (A-1) was subjected to infrared spectroscopic analysis, and as a result, an absorption band (1,635 cm$^{-1}$) derived from a C=C stretching vibration of an acryloyl group, an absorption band (1,409 cm$^{-1}$) derived from a CH$_2$ in-plane bending vibration of an acryloyl group and an absorption band (810 cm$^{-1}$) derived from a CH$_2$ out-of-plane bending vibration of an acryloyl group were observed, and further an absorption band (2,274 cm$^{-1}$) derived from an NCO stretching vibration of BEI disappeared, whereby it was confirmed that an acryloyl group is present in the fluorinated polymer (A-1).

Examples 2 to 5

Preparation of fluorinated polymers (A-2), (A-3), (A-4) and (R-1)

Copolymers 2 to 5 were obtained by polymerization reactions in the same manner as in preparation of copolymer 1 except that mixing of materials was changed as shown in Table 1. Then, fluorinated polymers (A-2), (A-3), (A-4) and (R-1) were obtained by reactions in the same manner as in preparation of fluorinated polymer (A-1) except that mixing of materials was changed as shown in Table 2. The number average molecular weight of the obtained fluorinated polymer, the content of fluorine atoms in the fluorinated polymer, the number of ethylenic double bonds (C=C) per molecule and the acid value (mgKOH/g) are shown in Table 2.

TABLE 1

| Copolymerization reaction | Ex. 1 | Ex. 2 | Ex. 3 | Ex. 4 | Ex. 5 |
|---|---|---|---|---|---|
| C4FMA | — | 124.8 | — | — | — |
| C6FMA | 96.0 | — | 124.8 | 134.4 | 96.0 |
| MAA | 28.8 | 19.2 | 19.2 | 9.6 | 19.2 |
| 2-HEMA | 96.0 | 96.0 | 96.0 | 84.0 | 96.0 |
| CHMA | — | — | — | — | 28.8 |
| IBMA | 19.2 | — | — | 12.0 | — |
| V-70 | 3.6 | 4.1 | 3.9 | 4.6 | 4.2 |
| 2-ME | 7.8 | 4.7 | 4.7 | 2.3 | 2.3 |
| Acetone | 556 | 556 | 556 | 557 | 556 |
| Copolymer | 1 | 2 | 3 | 4 | 5 |
| Yield (g) | 239 | 237 | 237 | 235 | 238 |
| Number average molecular weight | 2320 | 3980 | 3940 | 5880 | 5950 |

TABLE 2

| Introduction of double bonds | Ex. 1 | Ex. 2 | Ex. 3 | Ex. 4 | Ex. 5 |
|---|---|---|---|---|---|
| (g) | | | | | |
| Copolymer 1 | 100 | — | — | — | — |
| Copolymer 2 | — | 100 | — | — | — |
| Copolymer 3 | — | — | 100 | — | — |
| Copolymer 4 | — | — | — | 100 | — |
| Copolymer 5 | — | — | — | — | 100 |
| BEI | 76.3 | 76.3 | 76.3 | 66.8 | — |
| AOI | — | — | — | — | 43.4 |
| DBTDL | 0.31 | 0.31 | 0.31 | 0.27 | 0.17 |
| BHT | 3.8 | 3.8 | 3.8 | 3.3 | 2.2 |
| Acetone | 100 | 100 | 100 | 100 | 100 |
| Fuorinated polymer | A-1 | A-2 | A-3 | A-4 | R-1 |
| Yield (g) | 182 | 178 | 178 | 175 | 185 |
| Number average molecular weight | 4300 | 7300 | 7250 | 11500 | 9500 |
| F atom content (%) | 11.0 | 12.9 | 14.3 | 16.3 | 13.6 |
| Number of C=C per molecule | 16.0 | 26.8 | 26.7 | 45.3 | 25.2 |
| Acid value (mgKOH/g) | 44 | 30 | 30 | 16 | 36 |

Examples 6 to 15

Preparation of Negative Photosensitive Composition, Formation and Evaluation of Partition Walls In the proportions (parts by mass) as identified in Tables 3 and 4, fluorinated polymers (A-1 to 4 and R-1), a photosensitive resin (B), a photopolymerization initiator (C), a radical crosslinking agent (D), a heat crosslinking agent (E), a silane coupling agent (F) and a diluent (G) were mixed to obtain a negative photosensitive composition.

The negative photosensitive composition was applied on a glass substrate by using a spinner, and dried on a hot plate at 100° C. for 2 minutes to form a coating film having a thickness of 2.0 µm. Then, via a mask (line/space=30 µm/30 µm), a coating film was irradiated with a prescribed amount of light exposure shown in Tables 3 and 4 by means of an ultrahigh pressure mercury lamp. Then, a non-exposed portion was dipped in a 0.2 mass % tetramethylammonium hydroxide aqueous solution for 40 seconds, and the non-exposed portion was washed off with water, followed by drying. Then, heating was carried out at 220° C. for 1 hour on a hot plate to obtain a glass substrate (1) having a pattern formed thereon. Further, the glass substrate (2) having a coating film cured product formed thereon was obtained in the same manner as the above except that the exposure was carried out without using the above mask. With respect to these substrates, the developability, the adhesion to these substrates, the water-and-oil repellency, an ink residue on partition walls and the uniformity in thickness, were measured and evaluated by the following methods. An evaluation results are shown in Tables 3 and 4.

Developability:

With regard to the glass substrate (1), one completely developed was identified by ○, and one having a portion not developed was identified by X.

Adhesion to the Substrate:

With regard to the above glass substrate (2), the adhesion was evaluated by the cross-cut tape method as disclosed in JIS K5400. The coating film was cross-cut by a cutter in a distance of 2 mm to have 25 sections. Then, an adhesive tape was bonded and peeled. The adhesion state of the coating film was visually evaluated in such a manner that symbol ○ indicates a case where no sections were peeled, and symbol X indicates a case where almost all sections were peeled.

Water and Oil Repellency:

The water-and-oil repellency was evaluated by the contact angle (degrees) of water and xylene on the surface of a coating film cured product of the above glass substrate (2). The contact angle is an angle between the solid surface and the tangent line against the liquid surface at a point where the solid and the liquid are in contact with each other, and it was defined by the angle on the side containing the liquid. The larger the angle, the better the water-and-oil repellency of the coating film cured product. The contact angle of water being at least 95° was represented by ○; the same contact angle being at least 90° and less than 95° was represented by Δ; and the same contact angle being less than 90° was represented by X. The contact angle of xylene being at least 40° was represented by ○ the same contact angle being at least 35° and less than 40° was represented by Δ; and the same contact angle being less than 35° was represented by X. Further, in Tables 3 and 4, the water-and-oil repellency is represented as (the contact angle of water)/(the contact angle of xylene)=○/○.

Ink Residue on Partition Walls:

With regard to the above glass substrate (1), about 30 pL of a 1% solution (water/ethanol=75/25) of poly-3,4-ethylene-dioxythiophene and polystyrene sulfonate was dropped onto a line portion (30 μm) as a partition wall by ink jetting method, and an ink residue remained in the line portion was evaluated. By visually observing a photograph obtained by Ultra-deep shape measuring microscope VK-8500 (manufactured by Keyence Corporation), the area of an ink residue remained in the line portion was compared with the area of an ink injected to a space portion (30 μm) as a dot, and the residue was evaluated such that ○ indicates a case of less than 1/10 and X indicates a case of at least 1/10.

Uniformity in Film Thickness:

With regard to the above glass substrate (1), about 30 pL of a 1% solution (water/ethanol=75/25) of poly-3,4-ethylene-dioxythiophene and polystyrene sulfonate was dropped into a space portion by ink jetting, and the thickness of an ink layer applied on the space portion was measured. The thickness was measured by Ultra-deep shape measuring microscope VK-8500 (manufactured by Keyence Corporation). When the thickness of the ink layer at a center portion is regarded as H and the thickness of an ink layer at an edge portion along the partition wall (line) is regarded as H, the uniformity in thickness was evaluated in such a manner that ○ indicates a case of $0.8H \leq H' \leq 1.2H$, and X indicates a case of $H' \leq 0.8H$ or $1.2H < H'$.

TABLE 3

| | | Example | | | | |
|---|---|---|---|---|---|---|
| | | 6 | 7 | 8 | 9 | 10 |
| Fluorinated polymer | | (A-1) | (A-1) | (A-2) | (A-3) | (A-3) |
| | | 0.25 | 2.5 | 0.25 | 0.25 | 0.23 |
| Photosensitive resin (B) | CCR1115 | 67.1 | 65.6 | 67.1 | 67.1 | — |
| | ZFR1492H | — | — | — | — | 83.9 |
| Photopolymerization initiator (C) | IR907 | 2.4 | 2.3 | 2.4 | 2.4 | — |
| | OXE01 | — | — | — | — | — |
| | OXE02 | — | — | — | — | 2.4 |
| | DEAB | 0.60 | 0.60 | 0.60 | 0.60 | — |
| | DETX-S | — | — | — | — | — |
| Radical crosslinking agent (D) | D310 | 42.1 | 41.1 | 42.1 | 42.1 | 23.4 |
| Heat crosslinking agent (E) | 157S65 | 10.2 | 10.0 | 10.2 | 10.2 | — |
| Silane coupling agent (F) | KBM403 | 4.2 | 4.1 | 4.2 | 4.2 | — |
| Diluting agent (G) | DEGDM | 147 | 149 | 147 | 147 | 146 |
| Coloring agent (H) | CB | — | — | — | — | 77.9 |
| Proportion in the total solid content of fluorinated polymer (%) | | 0.25 | 2.5 | 0.25 | 0.25 | 0.23 |
| Light Exposure 50 (mJ/cm²) | Developability | ○ | ○ | ○ | ○ | ○ |
| | Adhesion to the substrate | ○ | ○ | ○ | ○ | ○ |
| | Water and oil repellency | ○/○ | ○/○ | ○/○ | ○/○ | ○/○ |
| | Ink residue on partition walls | ○ | ○ | ○ | ○ | ○ |
| | Uniformity in film thickness | ○ | ○ | ○ | ○ | ○ |
| Light Exposure 100 (mJ/cm²) | Developability | ○ | ○ | ○ | ○ | ○ |
| | Adhesion to the substrate | ○ | ○ | ○ | ○ | ○ |
| | Water and oil repellency | ○/○ | ○/○ | ○/○ | ○/○ | ○/○ |
| | Ink residue on partition walls | ○ | ○ | ○ | ○ | ○ |
| | Uniformity in film thickness | ○ | ○ | ○ | ○ | ○ |
| Light Exposure 200 (mJ/cm²) | Developability | ○ | ○ | ○ | ○ | ○ |
| | Adhesion to the substrate | ○ | ○ | ○ | ○ | ○ |
| | Water and oil repellency | ○/○ | ○/○ | ○/○ | ○/○ | ○/○ |
| | Ink residue on partition walls | ○ | ○ | ○ | ○ | ○ |
| | Uniformity in film thickness | ○ | ○ | ○ | ○ | ○ |

TABLE 4

|  |  | Example |  |  |  |  |
|---|---|---|---|---|---|---|
|  |  | 11 | 12 | 13 | 14 | 15 |
| Fuorinated polymer |  | (A-3) 0.23 | (A-4) 0.25 | — | (R-1) 0.25 | (R-1) 0.23 |
| Photosensitive resin (B) | CCR1115 | — | 67.1 | 67.0 | 67.1 | — |
|  | ZFR1492H | 81.3 | — | — | — | 83.9 |
| Photopolymerization initiator (C) | IR907 | — | 2.4 | 2.4 | 2.4 | — |
|  | OXE01 | 2.4 | — | — | — | — |
|  | OXE02 | — | — | — | — | 2.4 |
|  | DEAB | — | 0.60 | 0.60 | 0.60 | — |
|  | DETX-S | 2.4 | — | — | — | — |
| Radical crosslinking agent (D) | D310 | 22.7 | 42.1 | 42.0 | 42.1 | 23.4 |
| Heat crosslinking agent (E) | 157S65 | — | 10.2 | 10.2 | 10.2 | — |
| Silane coupling agent (F) | KBM403 | — | 4.2 | 4.2 | 4.2 | — |
| Diluting agent (G) | DEGDM | 150 | 147 | 147 | 147 | 146 |
| Other | CB | 77.8 | — | — | — | 77.9 |
| Proportion in the total solid content of fluorinated polymer (%) |  | 0.23 | 0.25 | 0 | 0 | 0 |
| Light Exposure 50 (mJ/cm$^2$) | Developability | ○ | ○ | ○ | ○ | ○ |
|  | Adhesion to the substrate | ○ | ○ | ○ | ○ | ○ |
|  | Water and oil repellency | ○/○ | ○/○ | X/X | X/X | X/X |
|  | Ink residue on partition walls | ○ | ○ | X | X | X |
|  | Uniformity in film thickness | ○ | ○ | ○ | X | X |
| Light Exposure 100 (mJ/cm$^2$) | Developability | ○ | ○ | ○ | ○ | ○ |
|  | Adhesion to the substrate | ○ | ○ | ○ | ○ | ○ |
|  | Water and oil repellency | ○/○ | ○/○ | X/X | Δ/Δ | Δ/Δ |
|  | Ink residue on partition walls | ○ | ○ | X | X | X |
|  | Uniformity in film thickness | ○ | ○ | ○ | X | X |
| Light Exposure 200 (mJ/cm$^2$) | Developability | ○ | ○ | ○ | ○ | ○ |
|  | Adhesion to the substrate | ○ | ○ | ○ | ○ | ○ |
|  | Water and oil repellency | ○/○ | ○/○ | X/X | ○/○ | ○/○ |
|  | Ink residue on partition walls | ○ | ○ | X | X | X |
|  | Uniformity in film thickness | ○ | ○ | ○ | X | X |

In Example 13, the fluorinated polymer (A) is not incorporated, whereby the water-and-oil repellency of the coating film cured product is poor, and the amount of the ink residue on partition walls is high. In Examples 14 and 15, the fluorinated polymer contains no chain having at least two ethylenic double bonds, whereby the water-and-oil repellency of the coating film cured product is poor in the exposure of 50 mJ/cm$^2$, the amount of the ink residue on partition walls is high, and the uniformity in thickness is also poor. In the case of an exposure of 100 mJ/cm$^2$, the water-and-oil repellency of the coating film cured product is somewhat poor, the amount of the ink residue on partition walls is high, and the uniformity in thickness is also poor. In the case of an exposure of 200 mJ/cm$^2$, the amount of the ink residue on partition walls is high, and the uniformity in thickness is also poor.

INDUSTRIAL APPLICABILITY

The fluorinated resin (A) of the present invention is excellent in the photocurability at a low light exposure. Accordingly, the negative photosensitive composition having the fluorinated resin (A) of the present invention incorporated therein, may be used in an application which requires the water-and-oil repellency, and is excellent in achieving the water-and-oil repellency especially at a low light exposure. For example, such a composition is suitably used for formation of partition walls for e.g. the production of a color filter, the production of an organic EL display device or the production of a circuit wiring board employing an ink jet printing technique.

The entire disclosure of Japanese Patent Application No. 2005-361910 filed on Dec. 15, 2005 including specification, claims and summary is incorporated herein by reference in its entirety.

What is claimed is:

1. A fluorinated polymer which is a copolymer made of at least two monomers each having an ethylenic double bond, and which has a side chain having a $C_{20}$ or lower alkyl group in which at least one of its hydrogen atoms is substituted by a fluorine atom (provided that the alkyl group may contain an etheric oxygen atom between carbon atoms) and a side chain having at least two ethylenic double bonds per side chain.

2. The fluorinated polymer according to claim 1, which has a fluorine atom content of from 5 to 35 mass %.

3. The fluorinated polymer according to claim 1, which further has a side chain having an acidic group.

4. A fluorinated polymer which is a copolymer made of at least two monomers each having an ethylenic double bond, wherein the copolymer is formed by copolymerizing at least two monomers comprising a monomer having a $C_{20}$ or lower alkyl group in which at least one hydrogen atom in the alkyl group is substituted by a fluorine atom, and the alkyl group optionally comprises an etheric oxygen atom between carbon atoms, and a monomer having a reactive group, followed by reacting the copolymer formed with a compound having a functional group linkable with the reactive group and at least two ethylenic double bonds.

5. A negative photosensitive composition which is a composition comprising a fluorinated polymer (A) as defined in claim 1, a photosensitive resin (B) having an acidic group and an ethylenic double bond per molecule and a photopolymerization initiator (C), wherein the proportion of the fluorinated polymer (A) is from 0.1 to 30 mass % based on the total solid content of the composition.

6. A negative photosensitive composition which is a composition comprising a fluorinated polymer (A) as defined in claim 4, a photosensitive resin (B) having an acidic group and an ethylenic double bond per molecule and a photopolymerization initiator (C), wherein the proportion of the fluorinated polymer (A) is from 0.1 to 30 mass % based on the total solid content of the composition.

7. The composition according to claim 5, which further contains a radical crosslinking agent (D) having at least two ethylenic double bonds and no acidic groups.

8. The composition according to claim 6, which further contains a radical crosslinking agent (D) having at least two ethylenic double bonds and no acidic groups.

9. A partition wall made of a coating film cured product of the composition as defined in claim 5.

10. A partition wall made of a coating film cured product of the composition as defined in claim 6.

* * * * *